United States Patent [19]

Ertl et al.

[11] 4,098,223

[45] Jul. 4, 1978

[54] APPARATUS FOR HEAT TREATING SEMICONDUCTOR WAFERS

[75] Inventors: Wilhelm Ertl, Ottobrunn; Helmut Gückel, Neubiberg; Hugo Rüchardt, Gauting; Fritz Schneckenaichner, Munich, all of Germany

[73] Assignee: Siemens Aktiengesellschaft, Berlin & Munich, Germany

[21] Appl. No.: 738,675

[22] Filed: Nov. 4, 1976

[30] Foreign Application Priority Data

May 3, 1976 [DE] Fed. Rep. of Germany ....... 2619444
Jul. 2, 1976 [DE] Fed. Rep. of Germany ....... 2629951

[51] Int. Cl.² .................... C23C 11/00; B05C 13/02
[52] U.S. Cl. .................................. 118/48; 118/500; 432/124
[58] Field of Search ............... 118/48, 49, 500; 432/124, 121; 211/41

[56] References Cited

U.S. PATENT DOCUMENTS

| 1,754,294 | 4/1930 | Winter | 432/124 X |
| 2,085,339 | 6/1937 | Smith | 118/262 X |
| 2,579,737 | 12/1951 | Giordano, Jr. | 118/56 UX |
| 3,445,096 | 5/1969 | Seefluth | 432/124 X |
| 3,638,927 | 2/1972 | Wells | 432/124 X |
| 3,682,083 | 8/1972 | Puente | 211/41 X |
| 3,978,816 | 9/1976 | Saloom | 118/500 X |

FOREIGN PATENT DOCUMENTS

| 134,199 | 1960 | U.S.S.R. | 432/121 |
| 328,186 | 3/1972 | U.S.S.R. | 432/121 |
| 445,709 | 6/1975 | U.S.S.R. | 118/500 |

*Primary Examiner*—Wm. Carter Reynolds
*Attorney, Agent, or Firm*—Hill, Gross, Simpson, Van Santen, Steadman, Chiara & Simpson

[57] ABSTRACT

Method of heat treating semiconductor wafers in a continuous operation wherein the wafers are initially introduced into a tube where they are subjected to a heat treatment and then removed from the tube. The wafers are transported through the tube by a pair of horizontally disposed rods on which they are carried and by an additional guide rod which is located above the horizontal plane of the first rods. All three rods have a groove in the form of a screw thread into which the wafers may be seated. All three rods are caused to rotate in the same direction and the frictional contact of the wafers with the walls of each groove causes the wafers to rotate in the opposite direction from the rods while at the same time causing them to advance through the tube while being heated. If it is desired to have the entry speed and the exit speed to be faster or slower than that through the main body of the tube, the pitch of the screw thread may be increased or decreased, respectively, at the entrance and exit of the tube. The rods are preferably made of the same semiconductor material as the wafers.

1 Claim, 3 Drawing Figures

APPARATUS FOR HEAT TREATING SEMICONDUCTOR WAFERS

FIELD OF THE INVENTION

The present invention relates to a method of heat-treating semiconductor wafers in a continuous operation, in which semiconductor wafers are initially introduced into a tube, there subjected to the heattreatment and then removed from the tube.

BACKGROUND OF THE INVENTION

For heat-treatment processes (diffusion, oxidation and the like) of semiconductor wafers, normally a tube or furnace is used into which the wafers are introduced on a crucible. For mass production, it is of vital importance that all the wafers be subjected to the same conditions within the tube. This means that the temperature characteristic (temperature profile) over the length of the tube must be as far as possible constant.

In order to obtain this constant temperature profile, hitherto tubes have been used which are loaded and unloaded through the same end. If the tubes are loaded at a low "entry rate", something which is essential particularly when the semiconductor wafers are of large diameter, then inevitably differences in the temperature-time characteristics occur, and these give rise to a major degree of spread in the electrical parameters.

To achieve higher furnace capacities and more uniform temperature-time characteristics, already the possibility has been suggested of using several conveyor baffles or crucibles in a continuous process. In this context, the tube is loaded at one end and unloaded at the other. This, however, gives rise to high friction forces between the conveyor baffles and the wall of the tube. Furthermore, a tube made of quartz will bend at the high temperatures prevailing, due to the loading imposed by the conveyor baffles carrying the semiconductor wafers. Finally, the contact with the conveyor baffles produces nonuniform heating of the semiconductor wafers.

BRIEF SUMMARY OF THE INVENTION

It is an object of the invention to provide a method of heat-treating semiconductor wafers, which enables a very constant temperature-time characteristic to be achieved in a horizontally disposed tubular heating chamber in a continuous heat treatment operation.

This object is achieved in accordance with the invention in that the transfer of the semiconductor wafers through the tubular heating chamber is performed using horizontally disposed bars which rotate about axes parallel to the axis of the tube and whose surfaces contain grooves in the form of a screw thread.

In the method of the invention, a quartz tube provides the heating chamber and has assembled therein two silicon bars or rods whose ends project beyond the tube and are in each case supported there. The silicon rods are contour-ground to produce a formation like that of a screw thread. The pitch of the thread is designed to accord with automatic loading and unloading. By suitably profiling the ground formation, it is possible to secure the semiconductor wafers being processed, in the direction perpendicular to the rod axis. To this end, the profile of the screw thread like groove is of trapezoidal shape by preference, it being understood that the term "trapezoidal" refers to a geommetrical shape having two parallel and two non-parallel sides. Rotation of the rods in the same direction, produces forward motion on the part of the semiconductor wafers at the same time that the latter also rotate. In this way, uniform heating of the wafers is achieved, together with protection of the crystal lattice because no mechanical stresses of the kind due to temperature gradients, occur. Rotation of the semiconductor wafers ensures that the reaction gases flow round them uniformly. The freedom of choice in selecting the thread pitch, finally, makes it possible to use the method of the invention in automatic systems.

Extremely accurate guidance of the semiconductor wafers in the tube is achieved if at least two carrier rods are provided and at least one guide rod is used. In this way, the semiconductor wafers maintain their relative positions in a precise way so that particularly uniform heat treatment is achieved.

It has also been found that in numerous applications a semiconductor wafer should not pass through the entire tube at constant speed. For example, it may be advantageous if the wafers have a higher speed at the boundary zones of the tube, because, there, inevitably, there is a temperature gradient present, or if the wafers are not in the hottest zone of the tube for such a long time (for example, only ten minutes), in order that the semiconductor material is not exposed to an elevated temperature for too long a time.

It may, therefore, be convenient if a variable transfer rate on the part of the semiconductor wafers is made possible.

This is achieved by virtue of the fact that the pitch of the thread is variable and is adapted to the requisite wafer transfer rates in the individual zones of the tube. Preferably, the pitch will be increased in the boundary zones of the tube.

BRIEF DESCRIPTION OF THE DRAWINGS

In the following, the invention will be explained in more detail making reference to the drawing.

DESCRIPTION OF A PREFERRED EMBODIMENT

Figure 1:
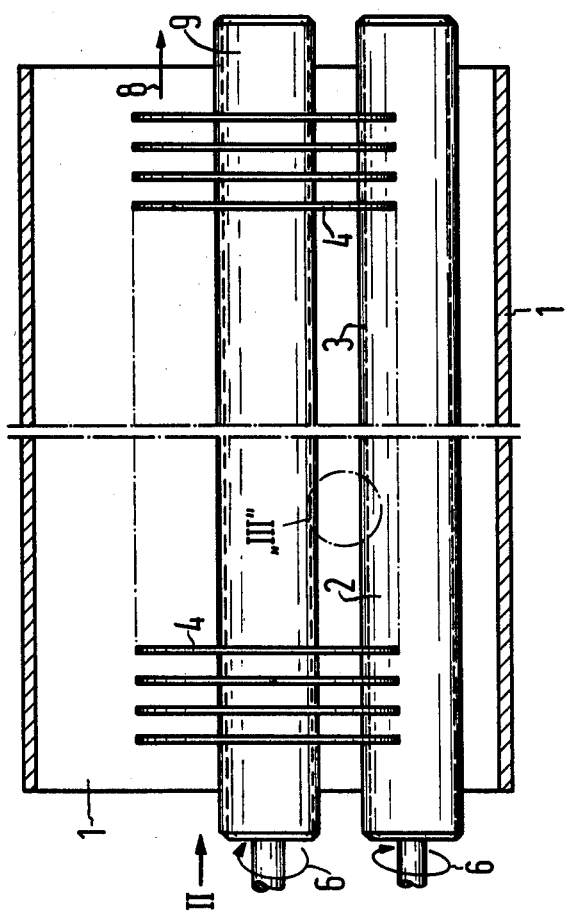
FIG. 1 is a longitudinal section through a tube loaded with semiconductor wafers.
Figure 2:
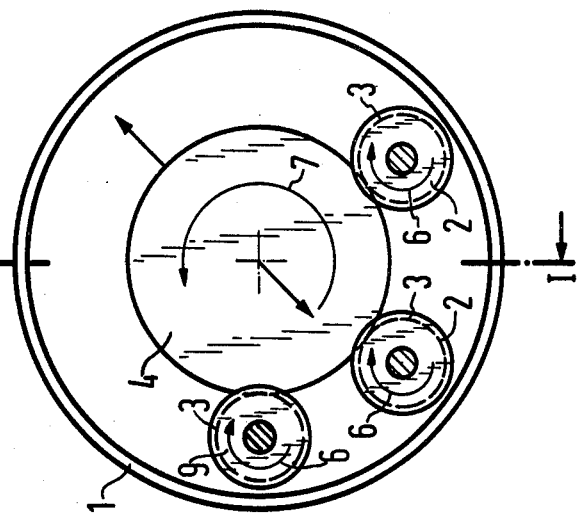
FIG. 2 is a side elevation taken in the direction of the arrow II, of the tube shown in FIG. 1.
Figure 3:
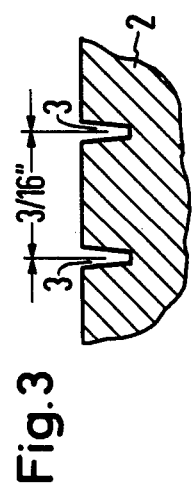
FIG. 3 is a fragmentary view of the enlarged bar (detail III of FIG. 1).

In a tubular chamber 1 of quartz or silicon which is used as a furnace for the heat treatment of semiconductor wafers 4, two carrier rods 2 consisting of silicon, and a guide rod 9 are provided, whose surfaces contain grooves 3 in the form of a screw thread. Carrier rods 2 support the total weigt of each wafer as well as providing guidance thereto, additional rod 9 provides further wafer guidance. The upper portion of each wafer above rod 9 is not engaged by a guidance rod. The rods 2, 9 are disposed horizontally and longitudinally of the tube 1 and rotate in the same direction as indicated in FIGS. 1 and 2 by means of arrows 6. This means that the semiconductor wafers 4 are carried and guided in the grooves 3, and made of silicon, these wafers having a diameter of two inches, rotate in the opposite direction (arrows 7 in FIG. 2). This causes them to move through the tubular chamber 1 in the direction indicated by the arrows 8 (FIG. 1). The pitch of the grooves 3 is matched to the desired speed of transfer of the semiconductor wafers 4 through the tube 1 and can vary over the length of the rods 2 and 9. The pitch of the threads varies near the ends of rods 2 and 9. A larger pitch, for example, at the boundary zones of the tube 1, thus leads to a higher transfer speed if the rods 2 and 9 continue to rotate at the same speed. Preferably, a pitch of 3/16 inch will be used.

The rods 2 and 9 project beyond the end of the tube 1 so that simple loading and unloading is made possible. The tube 1 will conveniently have a circular section. As will be apparent, however, a square or rectangular cross-section could be used.

It will be apparent to those skilled in the art that many modifications and variations may be effected without departing from the spirit and scope of the novel concepts of the present invention.

We claim as our invention:

1. A heating apparatus for heat treating semiconductor wafers comprising a tubular heating chamber, a pair of rods having similar grooves formed as a screw thread in the respective surfaces rotating at the same speed and in the same direction, said rods being disposed so as to support the total weight of said wafer, the groove of each rod being a trapezoidal cross-sectional shape and size to receive a wafer in a standing up position to frictionally grip the same, said wafers being thereby rotated in a direction opposite to the direction of rotation of the rods, said rods each extending out of the heating chamber at both ends, at least one additional rod which provides guidance to said wafers and having a screw thread type groove therein similar to the grooves in said pair of rods and located to engage said wafers on a side thereof above the plane of support of said wafers by said pair of rods, said additional rod rotating at the same speed and in the same direction as said pair of rods, in which the pitch of said screw thread type groove gradually increases in each rod near the ends of said tubular heating chamber and the upper portions of said wafers not being engaged by said pair of rods and said additional rod.

* * * * *